United States Patent
Ahn et al.

(10) Patent No.: US 8,536,688 B2
(45) Date of Patent: Sep. 17, 2013

(54) INTEGRATED CIRCUIT LEADFRAME AND FABRICATION METHOD THEREFOR

(75) Inventors: Byung Hoon Ahn, Singapore (SG); Pandi Chelvam Marimuthu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 847 days.

(21) Appl. No.: 11/007,896

(22) Filed: Dec. 8, 2004

(65) Prior Publication Data

US 2005/0263861 A1    Dec. 1, 2005

Related U.S. Application Data

(60) Provisional application No. 60/574,682, filed on May 25, 2004.

(51) Int. Cl.
*H01L 23/495* (2006.01)
*H01L 23/48* (2006.01)

(52) U.S. Cl.
USPC ........... 257/676; 257/666; 257/784; 257/787; 257/E23.037; 438/123; 438/126; 438/617

(58) Field of Classification Search
USPC ................ 257/666, 676, 674, 787, 669, 784, 257/E23.037; 438/123, 126
See application file for complete search history.

(56) References Cited

U.S. PATENT DOCUMENTS

| | | | | |
|---|---|---|---|---|
| 5,844,306 A | * | 12/1998 | Fujita et al. | 257/676 |
| 6,075,282 A | * | 6/2000 | Champagne | 257/675 |
| 6,198,163 B1 | | 3/2001 | Crowley et al. | |
| 6,380,048 B1 | | 4/2002 | Boon et al. | |
| 6,388,311 B1 | * | 5/2002 | Nakashima et al. | 257/676 |
| 6,396,129 B1 | * | 5/2002 | Hung et al. | 257/666 |
| 6,713,322 B2 | * | 3/2004 | Lee | 438/123 |
| 6,818,973 B1 | * | 11/2004 | Foster | 257/676 |
| 6,876,068 B1 | * | 4/2005 | Lee et al. | 257/676 |
| 6,965,157 B1 | * | 11/2005 | Perez et al. | 257/666 |
| 7,026,710 B2 | * | 4/2006 | Coyle et al. | 257/704 |
| 2002/0117740 A1 | * | 8/2002 | Jang et al. | 257/677 |
| 2002/0163015 A1 | * | 11/2002 | Lee et al. | 257/200 |
| 2003/0001244 A1 | * | 1/2003 | Araki et al. | 257/666 |
| 2004/0080026 A1 | * | 4/2004 | Minamio et al. | 257/666 |

* cited by examiner

*Primary Examiner* — Nitin Parekh
(74) *Attorney, Agent, or Firm* — Ishimaru & Associates LLP

(57) ABSTRACT

An integrated circuit leadframe and a fabrication method for fabricating the integrated circuit leadframe include forming a leadframe having leads around a die pad that has a peripheral die pad rim. A discrete, alternately staggered surface configuration is formed in the die pad rim. The discrete, alternately staggered surface configuration creates space in the die pad for connecting and separating ground bond wire-bonds and down bond wire-bonds, and provides for locking encapsulant firmly to the die pad.

20 Claims, 4 Drawing Sheets

INTEGRATED CIRCUIT LEADFRAME AND FABRICATION METHOD THEREFOR

CROSS-REFERENCE TO RELATED APPLICATIONS

This application claims the benefit of U.S. Provisional Patent Application Ser. No. 60/574,682 filed May 25, 2004, and the subject matter thereof is hereby incorporated herein by reference thereto.

TECHNICAL FIELD

The present invention relates generally to integrated circuits, and more particularly to leadframes for integrated circuits.

BACKGROUND ART

In the electronics industry, a continuing goal has been to reduce the size of electronic devices, such as camcorders and portable telephones, while increasing performance and speed. Integrated circuit packages for complex electronic systems typically have a large number of interconnected integrated circuit chips. The integrated circuit chips are usually made from a semiconductor material such as silicon or gallium arsenide. The various semiconductor devices on the integrated circuit chips are formed in various layers on the chips using photolithographic techniques. After manufacture, the chips are typically incorporated into packages that are then mounted on printed circuit wiring boards.

Integrated circuit chip packages typically have numerous external pins that are mechanically attached by solder or a variety of other known techniques to conductor patterns on the printed circuit wiring boards.

Typically, the packages in which these integrated circuit semiconductor chips are mounted include a substrate or other chip mounting device. One example of such a substrate is a leadframe. High performance leadframes typically are multi-layer structures including power, ground, and signal layers that may be on separate planes.

More particularly, a leadframe is a metal frame that includes a centrally located die paddle or die pad and a plurality of peripherally-located leads that surround the die pad. The die pad mounts the semiconductor chip (or "die"). Power, ground, and/or signal leads of the leadframe are connected electrically by wire bonds to power, ground, and/or signal sites on the chip and serve as external connecting means for the chip.

After the chip is wire-bonded to the leads, the chip, the die pad, and portions of the leads are encapsulated in a plastic, an epoxy-molded compound, or a multi-part housing made of plastic, ceramic, or metal, to form the semiconductor package. The package protects the leadframe and the chip from physical, electrical, moisture, and/or chemical damage.

The package is then mounted, for example on a circuit board or card, for incorporation into any of a wide variety of devices such as computers, cellular telephones, automobiles, appliances, and so forth.

Some leadframe configurations, for example exposed die pad packages, include a separate ground ring structure that is supported around the periphery of the die pad and inside the inner ends of the leads. The ground ring facilitates the many bonding wire electrical connections that typically must be made to connect ground pads on the die to electrical ground connections on the leadframe.

However, leadframes designed with such a ground ring require additional clearance space (i.e., distance) between the die pad and the ground ring and between the ground ring and the inner tips of the peripherally-located leads. This clearance space is necessary for ease of manufacturing and for proper looping of the bonding wires from the die to the ground ring and from the ground ring to the lead tips. Unfortunately, this increases the lengths of the other bonding wires that connect the die to other (e.g., power and signal) leads on the leadframe.

The requirement for ground ring clearance space thus increases the net distance between the die and the lead tips. Typically, there are more wires that connect dies to the power and signal lead tips than to the ground ring and to the ground lead tips. Hence, a ground ring causes the total wire length per die to increase, which correspondingly increases costs. Not only are costs increased, but the additional wire lengths also make the wires prone to sweeping problems during molding. ("Sweeping" of the bonding wires happens during molding of the semiconductor package. Specifically, sweeping happens when the epoxy molding compound pushes the bonding wires out of position as the epoxy molding compound flows past the bonding wires. Sweeping causes bonding wires to short circuit and/or to break.)

Some die pad configurations provide a die pad that is slightly wider than the die and that have continuous grooves in the die pad area just outside the perimeter of the die. The continuous grooves help secure the molding compound to the die pad and thus to the leadframe. However, such continuous grooves contain inadequate space for connecting ground bonds and down bonds to the die pad. The continuous grooves thus effectively prevent ground bonds and down bonds from being attached to the die pad by taking the perimeter die pad area away from such use. In addition, such grooves provide only minor locking of the molding compound to the leadframe, rendering their value and utility only marginal.

As a result, these and other current designs still require a separate ground ring and are therefore subject to the problems of long, looping bonding wires that may lead to wire sweeping, wire shorting, and/or wire breakage during molding.

The separate ground ring also makes wire bonding more difficult because it is not possible to clamp directly onto the ground ring while making the wire bonds. Instead, the ground ring must be held in position indirectly, such as by a device attached to the die pad (e.g., by vacuum suction). The strength of such wire bonds is not as good as the strength of wire bonds made to a surface that is clamped or is held directly by vacuum. These weaker wire bonds increase the rate that the bonding wire connections break during molding, resulting in poor production and manufacturing yields.

Thus, a need still remains for bond separator methods and apparatus for integrated circuit leadframes and packages that will allow space on the die pad that can be used for ground bond and down bond connections, while simultaneously serving, in the same die pad area space, to securely and firmly lock the mold compound to the die pad. Such leadframe bond separator methods and apparatus must provide these advantages and functions without requiring a separate ground ring or increasing manufacturing expenses and costs. In view of the ever increasing complexity and decreasing sizes of integrated circuit dies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit leadframe and a fabrication method for fabricating the integrated circuit leadframe. A leadframe is formed having leads around a die pad that has a peripheral die pad rim. A discrete, alternately staggered surface configuration is formed in the die pad rim. The discrete, alternately staggered surface configuration creates space in the die pad for connecting and separating ground bond wire-bonds and down bond wire-bonds, and provides for locking encapsulant firmly to the die pad.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
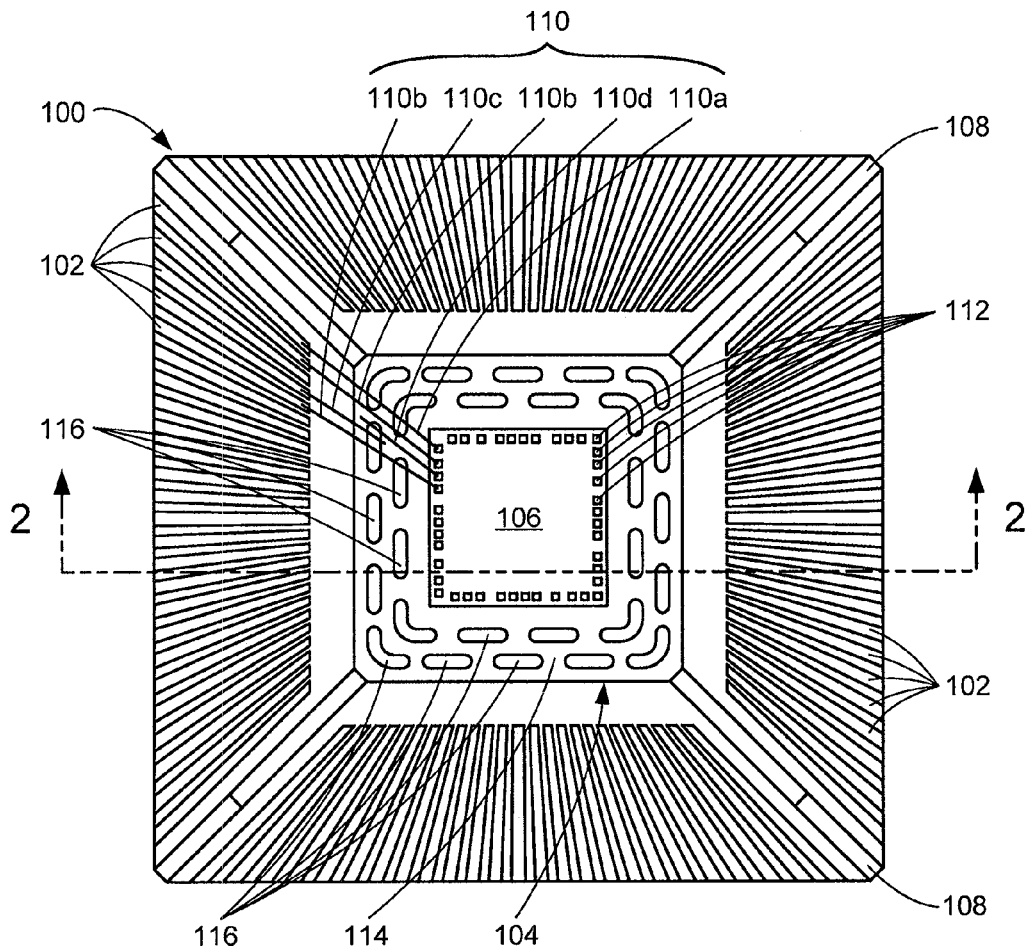
FIG. 1 is a plan view of a leadframe according to an embodiment of the present invention, and showing various components thereon.

In the following description, numerous specific details are given to provide a thorough understanding of the invention. However, it will be apparent that the invention may be practiced without these specific details. In order to avoid obscuring the present invention, some well-known configurations and process steps are not disclosed in detail.

Likewise, the drawings showing embodiments of the invention are semi-diagrammatic and not to scale and, particularly, some of the dimensions are for the clarity of presentation and are shown exaggerated in the FIGs. Also, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the die pad of a leadframe, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

Leadframe semiconductor packages are well known and widely used throughout the electronics industry to house, mount, and interconnect a variety of integrated circuits ("ICs"). An IC is typically formed on a single die, or "chip", that is cut from a semiconductor wafer containing a large number of identical dies. The dies themselves are relatively small and fragile, and are susceptible to harmful environmental elements, particularly moisture. Accordingly, the dies must be packaged in robust, yet affordable, packages that protect the dies while permitting them to be reliably mounted on, for example, a printed circuit board ("PCB") and to be interconnected with various associated electronic components.

A conventional leadframe (not shown) is typically die-stamped or etched from a sheet of metal such as a copper or steel alloy. The leadframe characteristically includes a plurality of electrically conductive leads that are temporarily held together in a planar arrangement about a central die mounting paddle or "die pad". The leads are held together by a plurality of expendable longitudinal and lateral tie-bars that form a frame embracing the leads. The die pad, which is configured for mounting a semiconductor die thereon, is supported within the surrounding leadframe leads by one or more die pad support leads connecting to the tie-bars.

During manufacture of the integrated circuit package, an IC die is attached to the die pad, typically by solder or a layer of adhesive. After the die is attached to the die pad, wire-bonding pads on top of the die are electrically connected ("wire-bonded") to corresponding ones of the inner ends of the leadframe leads by fine conductive bonding wires. These connections connect power, ground, and signals between the die and the leads of the leadframe. Additionally, some leadframe die pads are large enough to allow "down-bonding" from some of the die wire-bonding pads. "Down-bonding" is a process that allows some of the grounding pads on the die to be bonded downwardly by bonding wires directly to the leadframe die pad. Down-bonding thereby grounds the ground pads on the die directly to the leadframe die pad.

When wire-bonding is complete, each of the bonded die and leadframe assemblies is placed between the halves of a mold (not shown) to mold a protective envelope (not shown) around the assembly. The protective envelope is typically composed of a high density plastic or epoxy resin, and encloses and seals the die, the inner ends of the leadframe leads, and the wire bonds against harmful environmental elements.

After molding, the temporary tie-bars are cut away and discarded since their function is assumed by the rigid protective envelope. The outer ends of the leads are not enclosed by the protective envelope, but rather are left exposed for connection to other circuitry (not shown).

Referring now to FIG. 1, therein is shown a plan view of a leadframe 100 according to an embodiment of the present invention. The leadframe 100 may be manufactured from a single flat sheet of material, usually metal, in a single stamping, cutting, and forming process. Alternatively, the leadframe 100 may be manufactured using an etch process, which can avoid constraints caused by tool making issues that are typical in certain stamping processes.

The leadframe 100 includes a number of leads 102 around the periphery thereof. The leads 102 may be held in position by conventional tie bars (not shown) until the leadframe is encapsulated in a package (not shown, but see the package 200 in FIG. 2). In the center of the leadframe 100 is located a frame paddle that serves as a die pad 104 for attaching, mounting, and supporting a semiconductor device, such as a die 106, in the center of the leadframe 100. The die pad 104 is supported in this position by one or more corner tie bars 108 that are elongated inwardly to connect to and support the die pad 104.

Wire-bonds 110 wire-bond the die 106 to the leadframe 100. In particular, the wire-bonds 110 connect die wire-bonding pads 112 on the die 106 to the leads 102 of the leadframe 100 and to the die pad 104. The wire-bonds 110 include, for example, power wire-bonds 110a, signal wire-bonds 110b, ground bond wire-bonds 110c, and down bond wire-bonds 110d. For clarity of illustration only a few of the wire-bonds 110 are shown, but it will be understood that numerous wire-bonds of various types are attached between the die wire-bonding pads 112, the leads 102, and the die pad 104.

For accommodating the ground bond wire-bonds 110c and the down bond wire-bonds 110d, the lateral dimensions of the die pad 104 are larger than those of the die 106 that is attached thereon. The larger lateral dimensions of the die pad 104, outside the die 106, provide a die pad rim 114 that is peripheral to the die pad 104 and to which the ground bond wire-bonds 110c and the down bond wire-bonds 110d can then be attached.

To facilitate attachment of the ground bond wire-bonds 110c and the down bond wire-bonds 110d to the die pad 104, the die pad rim 114 of the die pad 104 is provided with grooves 116 that are arranged in a sequence of discrete grooves that are alternately staggered along and around the die pad rim 114 preferable on three or four sides of the die pad 104. The grooves 116 thus form a discrete, alternately staggered surface configuration in the die pad 104 that creates more space in the die pad 104 for connecting and separating the ground bond wire-bonds 110c and the down bond wire-bonds 110d. The ground bond wire-bonds 110c and the down bond wire-bonds 110d can be attached on sides of the grooves 116 opposite the die 106 and sides of the grooves facing the die 106. The grooves also serve the additional purpose of locking the mold compound encapsulant (not shown, but see the encapsulant 202 in FIG. 2) firmly to the die pad 104. The ground connection of the various ground bond wire-bonds 110c and the down bond wire-bonds 110d to the die pad rim 114 of the die pad 104 is thus efficiently accomplished without a separate ground ring such as would be otherwise conventionally disposed between the die pad 104 and the leads 102 of the leadframe 100.

Based on this disclosure, it will now be clear to one of ordinary skill in the art that the shape, size, positions, and number of rows of staggered grooves can be optimized in relation to the size of the die, the size of the die pad, and the number and spacing (or density) of the ground bond wire-bonds and down bond wire-bonds. For example, more staggered rows of the grooves can be designed and incorporated into the die pad rim if the die size is small compared to the die pad size, and vice versa. Also, the lengths and positions of the grooves can be designed flexibly to suit the positions of the ground bond wire-bonds and down bond wire-bonds in various IC designs. Further, since the grooves are separation structures for separating the ground bond wire-bonds and the down bond wire-bonds, it will be understood that the groove structures can be seen as providing raised as well as depressed areas.

Figure 2:
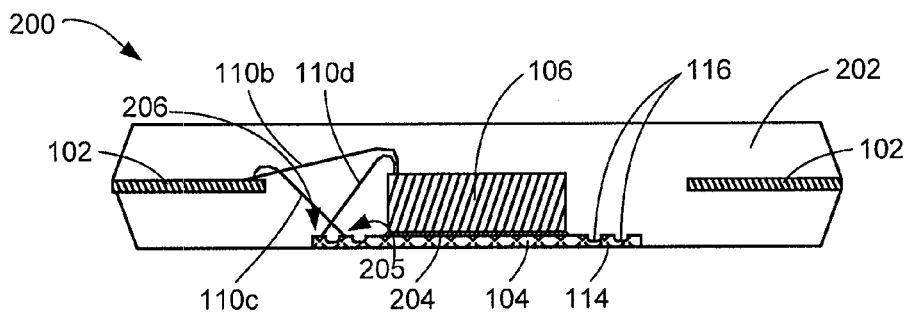
FIG. 2 is a cross-sectional view of a package formed by encapsulating the leadframe and components of FIG. 1 in an encapsulant.

Referring now to FIG. 2, therein is shown a cross-sectional view of a package 200 formed by encapsulating the leadframe 100, the die 106, and the wire-bonds 110 in an encapsulant 202. The FIG. 2 sectional view corresponds generally to the section line 2-2 through the assembly shown in FIG. 1. Also shown in FIG. 2 is an adhesive 204, such as solder or a layer of epoxy, that adheres the die 106 to the die pad 104. The die pad 104 includes an inner raised surface 205 and an outer raised surface 206 of the die pad rim 114. One of the grooves 116 is between the inner raised surface 205 and the outer raised surface 206. The inner raised surface 205 and one of the grooves 116 are between the die 106 and the outer raised surface 206. The ground bond wire-bonds 110c can be attached between the leads 102 and the inner raised surface 205 of the die pad rim 114.

Figure 3:
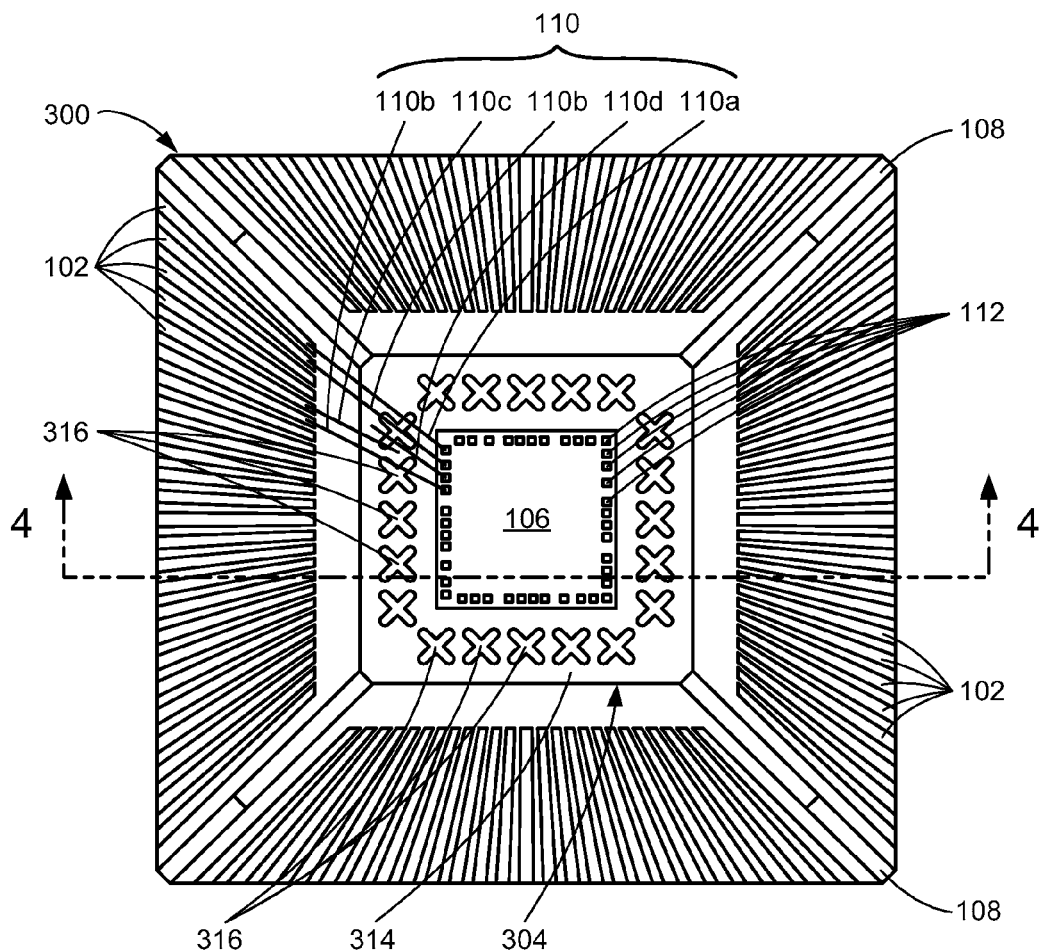
FIG. 3 is a plan view of a leadframe according to another embodiment of the present invention, and showing various components thereon.

Referring now to FIG. 3, therein is shown a plan view of a leadframe 300 according to another embodiment of the present invention. The leadframe 300 may be manufactured from a single flat sheet of material, usually metal, in a single stamping, cutting, and forming process. Alternatively, the leadframe 300 may be manufactured using an etch process, which can avoid constraints caused by tool making issues that are typical in certain stamping processes.

The leadframe 300 also includes a number of leads 102 around the periphery thereof. The leads 102 may be held in position by conventional tie bars (not shown) until the leadframe is encapsulated in a package (not shown, but see the package 400 in FIG. 4). In the center of the leadframe 300 is located a frame paddle that serves as a die pad 304 for attaching, mounting, and supporting a semiconductor device, such as a die 106, in the center of the leadframe 300. The die pad 304 is supported in this position by one or more corner tie bars 108 that are elongated inwardly to connect to and support the die pad 304.

Wire-bonds 110 wire-bond the die 106 to the leadframe 300. In particular, the wire-bonds 110 connect die wire-bonding pads 112 on the die 106 to the leads 102 of the leadframe 300 and to the die pad 304. The wire-bonds 110 include, for example, power wire-bonds 110a, signal wire-bonds 110b, ground bond wire-bonds 110c, and down bond wire-bonds 110d. For clarity of illustration only a few of the wire-bonds 110 are shown, but it will be understood that numerous wire-bonds of various types are attached between the die wire-bonding pads 112, the leads 102, and the die pad 304.

For accommodating the ground bond wire-bonds 110c and the down bond wire-bonds 110d, the lateral dimensions of the die pad 304 are larger than those of the die 106 that is attached thereon. The larger lateral dimensions of the die pad 304, outside the die 106, provide a die pad rim 314 that is peripheral to the die pad 304 and to which the ground bond wire-bonds 110c and the down bond wire-bonds 110d can then be attached.

To facilitate attachment of the ground bond wire-bonds 110c and the down bond wire-bonds 110d to the die pad 304, the die pad rim 314 of the die pad 304 is provided with X-shaped grooves 316 that are discrete and arranged in a sequence that is spaced along and around the die pad rim 314. The X-shaped grooves 316 thus form a discrete, alternately staggered surface configuration in the die pad 304 that creates more space in the die pad 304 for connecting and separating the ground bond wire-bonds 110c and the down bond wire-bonds 110d. The X-shaped grooves also serve the additional purpose of locking the mold compound encapsulant (not shown, but see the encapsulant 202 in FIG. 4) firmly to the die pad 304. The ground connection of the various ground bond wire-bonds 110c and the down bond wire-bonds 110d to the die pad rim 314 of the die pad 304 is thus efficiently accomplished without a separate ground ring such as would be otherwise conventionally disposed between the die pad 304 and the leads 102 of the leadframe 300.

As with the grooves 116 (FIG. 1), the shape, size, positions, and number of rows of the X-shaped grooves can be optimized in relation to the size of the die, the size of the die pad, and the number and spacing (or density) of the ground bond wire-bonds and down bond wire-bonds. For example, more rows of the X-shaped grooves can be designed and incorporated into the die pad rim if the die size is small compared to the die pad size, and vice versa. Also, the sizes and positions of the X-shaped grooves can be designed flexibly to suit the positions of the ground bond wire-bonds and down bond wire-bonds in various IC designs. Further, since the X-shaped grooves are separation structures for separating the ground bond wire-bonds and the down bond wire-bonds, it will be understood that the groove structures can be seen as providing raised as well as depressed areas.

Figure 4:
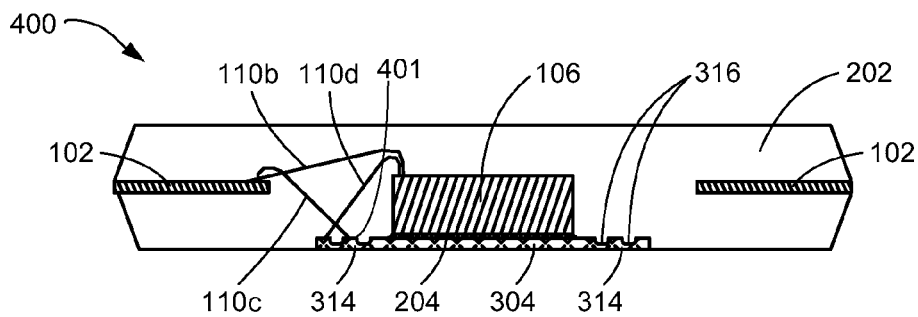
FIG. 4 is a cross-sectional view of a package formed by encapsulating the leadframe and components of FIG. 3 in an encapsulant.

Referring now to FIG. 4, therein is shown a cross-sectional view of a package 400 formed by encapsulating the leadframe 300, the die 106, and the wire-bonds 110 in an encapsulant 202. The FIG. 4 sectional view corresponds generally to the section line 4-4 through the assembly shown in FIG. 3. Also shown in FIG. 4 is an adhesive 204, such as solder or a layer of epoxy, that adheres the die 106 to the die pad 304. The ground bond wire-bonds 110c are attached from the leads 102 to a raised surface 401 of the peripheral die pad rim 314.

Figure 5:
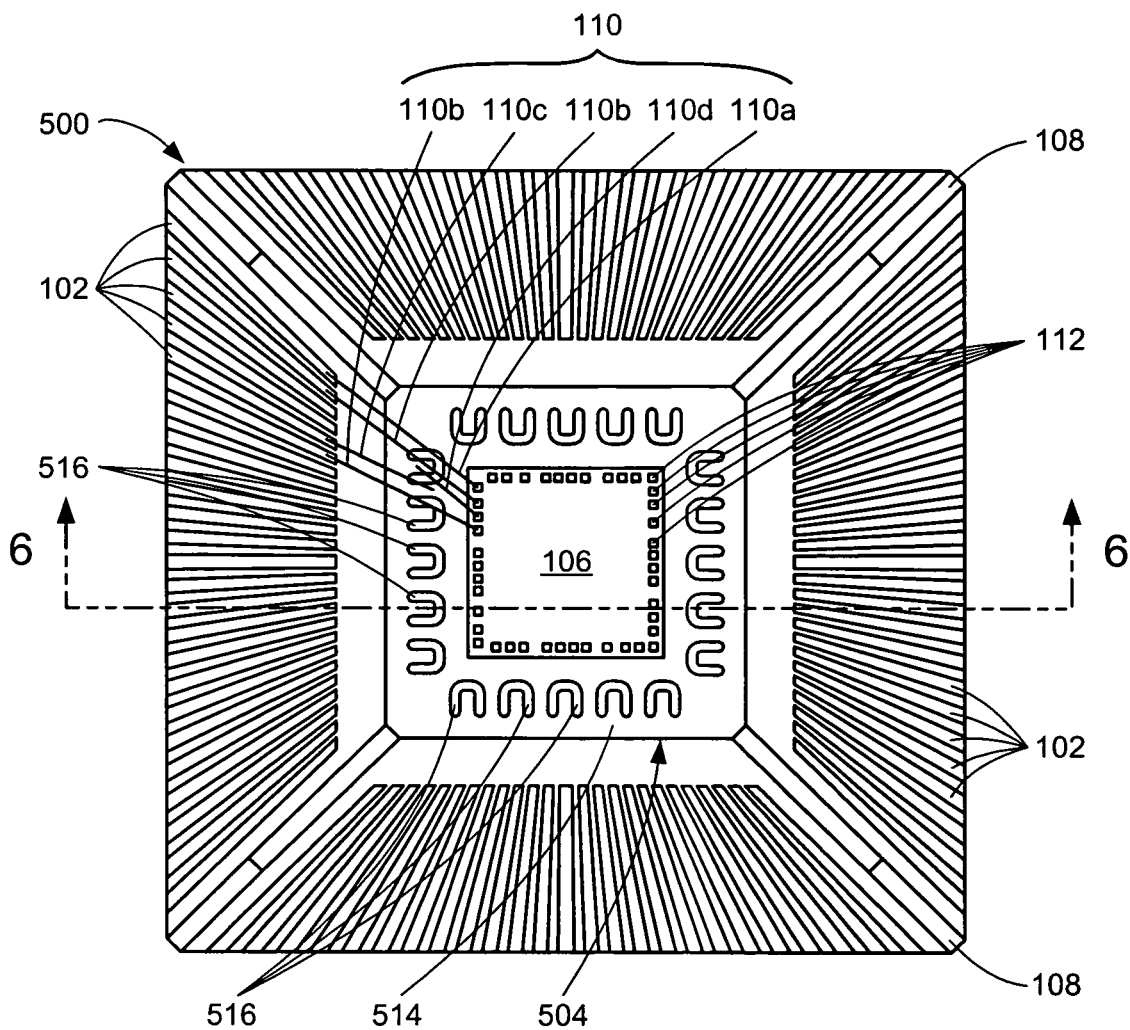
FIG. 5 is a plan view of a leadframe according to yet another embodiment of the present invention, and showing various components thereon.

Referring now to FIG. 5, therein is shown a plan view of a leadframe 500 according to yet another embodiment of the present invention. The leadframe 500 may be manufactured from a single flat sheet of material, usually metal, in a single stamping, cutting, and forming process. Alternatively, the leadframe 500 may be manufactured using an etch process, which can avoid constraints caused by tool making issues that are typical in certain stamping processes.

The leadframe 500 includes a number of leads 102 around the periphery thereof. The leads 102 may be held in position by conventional tie bars (not shown) until the leadframe is encapsulated in a package (not shown, but see the package 600 in FIG. 6). In the center of the leadframe 500 is located a frame paddle that serves as a die pad 504 for attaching, mounting, and supporting a semiconductor device, such as a die 106, in the center of the leadframe 500. The die pad 504 is supported in this position by one or more corner tie bars 108 that are elongated inwardly to connect to and support the die pad 504.

Wire-bonds 110 wire-bond the die 106 to the leadframe 500. In particular, the wire-bonds 110 connect die wire-bonding pads 112 on the die 106 to the leads 102 of the leadframe 500 and to the die pad 504. The wire-bonds 110 include, for example, power wire-bonds 110a, signal wire-bonds 110b, ground bond wire-bonds 110c, and down bond wire-bonds 110d. For clarity of illustration only a few of the wire-bonds 110 are shown, but it will be understood that numerous wire-bonds of various types are attached between the die wire-bonding pads 112, the leads 102, and the die pad 504.

For accommodating the ground bond wire-bonds 110c and the down bond wire-bonds 110d, the lateral dimensions of the die pad 504 are larger than those of the die 106 that is attached thereon. The larger lateral dimensions of the die pad 504, outside the die 106, provide a die pad rim 514 that is peripheral to the die pad 504 and to which the ground bond wire-bonds 110c and the down bond wire-bonds 110d can then be attached.

To facilitate attachment of the ground bond wire-bonds 110c and the down bond wire-bonds 110d to the die pad 504, the die pad rim 514 of the die pad 504 is provided with U-shaped grooves 516 that are discrete and arranged in a sequence that is spaced along and around the die pad rim 514. The U-shaped grooves 516 thus form a discrete, alternately staggered surface configuration in the die pad 504 that creates more space in the die pad 504 for connecting and separating the ground bond wire-bonds 110c and the down bond wire-bonds 110d. The U-shaped grooves also serve the additional purpose of locking the mold compound encapsulant (not shown, but see the encapsulant 202 in FIG. 6) firmly to the die pad 504. The ground connection of the various ground bond wire-bonds 110c and the down bond wire-bonds 110d to the die pad rim 514 of the die pad 504 is thus efficiently accomplished without a separate ground ring such as would be otherwise conventionally disposed between the die pad 504 and the leads 102 of the leadframe 500.

As with the grooves 116 (FIG. 1), the shape, size, positions, and number of rows of the U-shaped grooves can be optimized in relation to the size of the die, the size of the die pad, and the number and spacing (or density) of the ground bond wire-bonds and down bond wire-bonds. For example, more rows of the U-shaped grooves can be designed and incorporated into the die pad rim if the die size is small compared to the die pad size, and vice versa. Also, the sizes and positions of the U-shaped grooves can be designed flexibly to suit the positions of the ground bond wire-bonds and down bond wire-bonds in various IC designs. Further, since the U-shaped grooves are separation structures for separating the ground bond wire-bonds and the down bond wire-bonds, it will be understood that the groove structures can be seen as providing raised as well as depressed areas.

Figure 6:
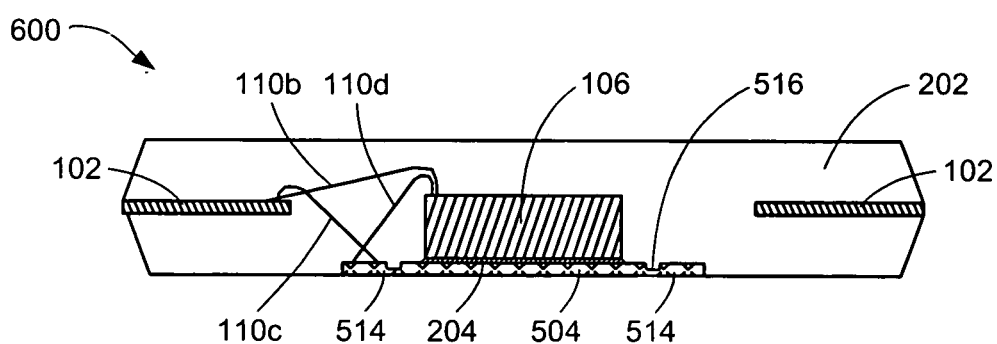
FIG. 6 is a cross-sectional view of a package formed by encapsulating the leadframe and components of FIG. 5 in an encapsulant.

Referring now to FIG. 6, therein is shown a cross-sectional view of a package 600 formed by encapsulating the leadframe 500, the die 106, and the wire-bonds 110 in an encapsulant 202. The FIG. 6 sectional view corresponds generally to the section line 6-6 through the assembly shown in FIG. 5. Also shown in FIG. 6 is an adhesive 204, such as solder or a layer of epoxy, that adheres the die 106 to the die pad 504.

Figure 7:
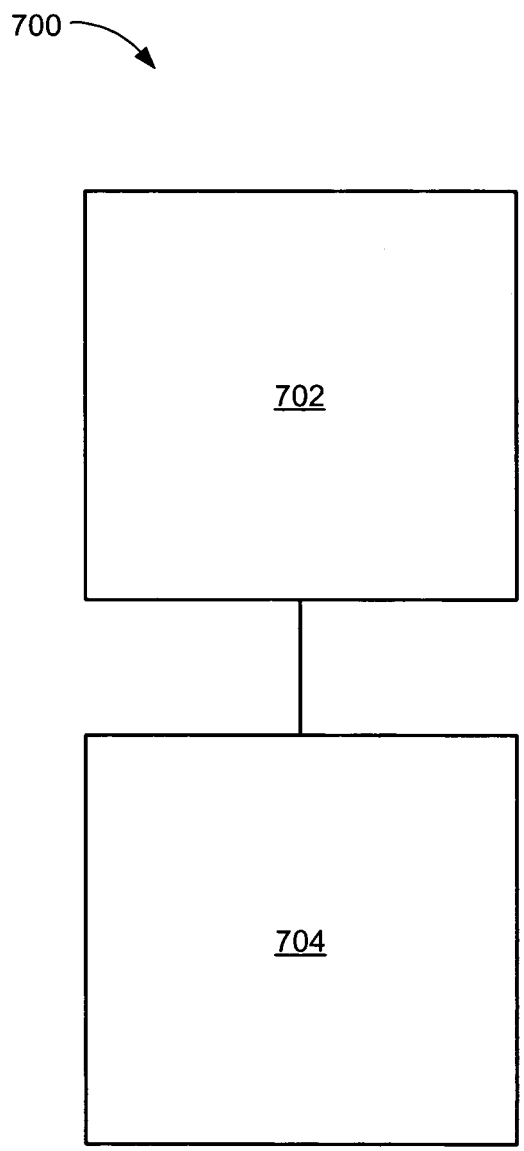
FIG. 7 is a flow chart of a method for fabricating an integrated circuit leadframe in accordance with the present invention.

Referring now to FIG. 7, therein is shown a flow chart of a method 700 for fabricating an integrated circuit leadframe in accordance with the present invention. The method 700 includes forming a leadframe having leads around a die pad that has a peripheral die pad rim, in a block 702; and forming a discrete, alternately staggered surface configuration in the die pad rim that creates space in the die pad for connecting and separating ground bond wire-bonds and down bond wire-bonds, and provides for locking encapsulant firmly to the die pad, in a block 704.

It has been discovered that the present invention provides numerous advantages. For example, the invention provides an IC package having a leadframe with a die pad that has an IC die mounted thereon. The IC die can have ground bond and/or down bond wire-bonds connected thereto, utilizing the die pad for corresponding ground connections as desired. The die pad has structures for separating the ground bond wire-bonds and the down bond wire-bonds. The structures can be seen as raised or depressed areas on the die pad and can have various different configurations according to the needs at hand.

A particular advantage of the present invention is that the surface configurations can be formed on either side, or both sides (top and bottom), of the die pad rim, according to the particular leadframe configuration that is to be fabricated. Thus, the invention has been illustrated in connection with, but is not limited to, exposed die pad packages (e.g., a quad flat pack ("QFP") package), in which the die pad is downset all the way to the bottom of the package. Accordingly, it will now be clear to one of ordinary skill in the art that the present invention can also be utilized in other package configurations, such as molded quad flat packages ("MQFP") and low profile quad flat packages ("LQFP"), in which the die pad is not downset so deeply, but is instead entirely enclosed within the package by the package encapsulant.

Accordingly, still another advantage of the present invention is that the term "surface configuration" therefore includes not only grooves that are formed only partially into and not through the die pad rim, but also includes grooves that extend all the way through the die pad rim. Such a groove that extends entirely through the die pad rim (i.e., a "through-groove") will thereby form a slot through the die pad rim.

Yet another advantage of the present invention, particularly for packages in which the die pad rim is enclosed within the package, is that surface configurations that are provided on both sides of the die pad rim (which can include through-groove surface configurations) will enhance even further the locking of the package molding compound to the die pad. This provides even greater resistance to delamination.

Another advantage of the present invention is the removal and/or omission of a ground ring in the leadframe. This enables the inner ends of the leads to be positioned closer to the die pad, resulting in shorter wire-bond wires for the wire-bonds that connect the die to the leads.

Conversely, still another advantage of the present invention is that it provides shorter wire-bond wires without requiring a ground ring or down ring.

Yet another advantage of the present invention is that it provides staggered structures, such as ridges or grooves, instead of continuous grooves, in the die pad.

Still another advantage of the present invention, as taught herein, is that a variety of groove configurations can be selected for optimizing the particular configurations at hand.

Another advantage of the present invention is the ample space that it provides for forming down bond and/or ground bond wire-bonds, even when the die size is large.

Yet another advantage of the present invention is the improved locking of the mold compound encapsulant to the leadframe afforded by the staggered grooves in the die pad rim around the die. The improved locking is provided while simultaneously providing additional space for ground bond and/or down bond wire-bonds.

Still another advantage of the design of the present invention is that the looping of the wire-bonding wires can be done such that sweeping and wire shorting are reduced or eliminated during molding of the package.

Thus, it has been discovered that the integrated circuit package with bond separator method and apparatus of the present invention furnish important and heretofore unknown and unavailable solutions, capabilities, and functional advantages for fabricating integrated circuit packages with bond separators. The resulting processes and configurations are straightforward, economical, uncomplicated, highly versatile and effective, can be implemented by adapting known technologies, and are thus fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

The invention claimed is:

1. A method for fabricating an integrated circuit leadframe, comprising:
    forming a leadframe having leads around a die pad, the die pad includes a peripheral die pad rim;
    adhering a die to the die pad;
    forming a surface configuration in the peripheral die pad rim including an inner raised surface, grooves, and an outer raised surface; the inner raised surface and one of the grooves being between the die and the outer raised surface; and
    attaching ground bond wire-bonds from the leads to the inner raised surface of the peripheral die pad rim, whereby the surface configuration is for providing clearance space for the ground bond wire-bonds from other wire-bonds.

2. The method of claim 1 wherein forming the surface configuration includes forming depressed separation structures.

3. The method of claim 1 wherein forming the surface configuration includes forming a sequence of discrete, alternately staggered grooves.

4. The method of claim 1 wherein forming the surface configuration includes forming X-shaped grooves for forming a discrete, alternately staggered surface configuration in the die pad.

5. The method of claim 1 wherein forming the surface configuration includes forming U-shaped grooves for forming a discrete, alternately staggered surface configuration in the die pad.

6. A method for fabricating an integrated circuit leadframe, comprising:
    forming a leadframe from a single flat sheet of material in a single manufacturing process, the leadframe having leads around a die pad, the die pad includes a peripheral die pad rim;
    forming a surface configuration in the peripheral die pad rim including an inner raised surface, grooves, and an outer raised surface;
    adhering a semiconductor device to the die pad, the inner raised surface and one of the grooves being between the semiconductor device and the outer raised surface;
    attaching ground bond wire-bonds from the leads to the inner raised surface of the peripheral die pad rim, whereby the surface configuration is for providing clearance space for the ground bond wire-bonds from other wire-bonds;
    wire-bonding the semiconductor device to the leadframe; and
    encapsulating at least portions of the semiconductor device and the leadframe.

7. The method of claim 6 wherein forming the surface configuration includes forming depressed separation structures.

8. The method of claim 6 wherein forming the surface configuration includes forming a sequence of discrete, alternately staggered grooves.

9. The method of claim 6 wherein forming the surface configuration includes forming X-shaped grooves for forming a discrete, alternately staggered surface configuration in the die pad.

10. The method of claim 6 wherein forming the surface configuration includes forming U-shaped grooves for forming a discrete, alternately staggered surface configuration in the die pad.

11. A leadframe for an integrated circuit, comprising:
    a die pad having:
        a peripheral die pad rim on the die pad, and
        a surface configuration having an inner raised surface, grooves, and an outer raised surface on the peripheral die pad rim;
    a die mounted on the die pad, the inner raised surface and one of the grooves being between the die and the outer raised surface;
    leads around the peripheral die pad rim; and
    ground bond wire-bonds attached from the leads to the inner raised surface of the peripheral die pad rim, whereby the surface configuration is for providing clearance space for the ground bond wire-bonds from other wire-bonds.

12. The leadframe of claim 11 wherein the surface configuration includes depressed separation structures.

13. The leadframe of claim 11 wherein the surface configuration includes a sequence of discrete, alternately staggered grooves.

14. The leadframe of claim 11 wherein the surface configuration includes X-shaped grooves for forming a discrete, alternately staggered surface configuration in the die pad.

15. The leadframe of claim 11 wherein the surface configuration includes U-shaped grooves for forming a discrete, alternately staggered surface configuration in the die pad.

16. A leadframe for an integrated circuit, comprising:
a die pad having:
a peripheral die pad rim on the die pad, and
a surface configuration having an inner raised surface, grooves, and an outer raised surface on the peripheral die pad rim;
a die mounted on the die pad, the inner raised surface and one of the grooves being between the die and the outer raised surface;
leads around the peripheral die pad rim;
ground bond wire-bonds attached from the leads to the inner raised surface of the peripheral die pad rim, whereby the surface configuration is for providing clearance space for the ground bond wire-bonds from other wire-bonds; and
an encapsulant encapsulating at least portions of the die and the leads.

17. The leadframe of claim 16 wherein the surface configuration includes depressed separation structures.

18. The leadframe of claim 16 wherein the surface configuration includes a sequence of discrete, alternately staggered grooves.

19. The leadframe of claim 16 wherein the surface configuration includes X-shaped grooves for forming a discrete, alternately staggered surface configuration in the die pad.

20. The leadframe of claim 16 wherein the surface configuration includes U-shaped grooves for forming a discrete, alternately staggered surface configuration in the die pad.

* * * * *